United States Patent
Chen et al.

(10) Patent No.: US 7,447,023 B2
(45) Date of Patent: Nov. 4, 2008

(54) HEAT DISSIPATION DEVICE FOR COMPUTER ADD-ON CARDS

(75) Inventors: Bing Chen, Shenzhen (CN); Xue-Wen Peng, Shenzhen (CN)

(73) Assignees: Fu Zhun Precision Industry (Shen Zhen) Co., Ltd., Shenzhen, Guangdong Province (TW); Foxconn Technology Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 11/608,650

(22) Filed: Dec. 8, 2006

(65) Prior Publication Data

US 2008/0137292 A1  Jun. 12, 2008

(51) Int. Cl.
*H05K 7/20* (2006.01)
(52) U.S. Cl. .................. 361/695; 361/690; 361/697; 165/80.3; 165/104.33; 174/16.1; 174/16.3
(58) Field of Classification Search .................. None
See application file for complete search history.

(56) References Cited

U.S. PATENT DOCUMENTS

| | | | |
|---|---|---|---|
| 6,253,834 B1 * | 7/2001 | Sterner | 165/80.3 |
| 6,549,404 B1 * | 4/2003 | Kitahara et al. | 361/695 |
| 6,643,131 B1 * | 11/2003 | Huang | 361/697 |
| 6,657,863 B2 * | 12/2003 | Lee et al. | 361/697 |
| 6,671,177 B1 * | 12/2003 | Han | 361/719 |
| 6,717,811 B2 * | 4/2004 | Lo et al. | 361/698 |
| 6,791,837 B2 * | 9/2004 | Chen et al. | 361/695 |
| 6,920,044 B2 * | 7/2005 | Lin | 361/697 |
| 6,930,882 B2 * | 8/2005 | Broder et al. | 361/695 |
| 6,940,716 B1 * | 9/2005 | Korinsky et al. | 361/695 |
| 7,002,797 B1 * | 2/2006 | Wittig | 361/695 |
| 7,050,300 B2 * | 5/2006 | Hein | 361/695 |
| 7,262,965 B2 * | 8/2007 | Cheng | 361/697 |
| 7,321,494 B2 * | 1/2008 | Han | 361/719 |
| 7,382,621 B2 * | 6/2008 | Peng et al. | 361/719 |
| 2002/0149910 A1 | 10/2002 | Lee et al. | |
| 2007/0047200 A1 * | 3/2007 | Huang | 361/695 |

* cited by examiner

*Primary Examiner*—Boris L Chervinsky
(74) *Attorney, Agent, or Firm*—Frank R. Niranjan

(57) ABSTRACT

A heat dissipation device is to be mounted in a computer enclosure for dissipating heat generated by a VGA card (10). The heat dissipation device includes a heat sink (90), a fan (60) and a fan duct (50) connecting the heat sink (90) and the fan (60). The heat sink (90) contacts a heat-generating device (12) of the VGA card. The fan (60) has an inlet port (62) and an outlet port (63). The outlet port (63) communicates with an ambient air outside the computer enclosure. The fan duct (50) has two open ends (55,52). One open end (55) engages with the heat sink (90) and the other open end (52) engages with the inlet port (62) of the fan (60).

13 Claims, 4 Drawing Sheets

HEAT DISSIPATION DEVICE FOR COMPUTER ADD-ON CARDS

BACKGROUND OF THE INVENTION

1. Field of the Invention

The present invention relates to a heat dissipation device for computer add-on cards and particularly a heat dissipation device mounted onto a VGA (video graphic array) card for dissipation heat generated by the VGA card.

2. Description of Related Art

In order to enable desktop and other computers to rapidly process graphics and game technology, add-on units, generally referred to as "graphics cards" or "VGA cards", are often installed in computer devices. Such cards comprise a separate processor, called a GPU (graphics processor unit). The GPU generates a large amount of heat during operation. When the temperature of the GPU exceeds a certain level, the GPU may malfunction, or in the worst case fail outright. For this reason, a heat sink is commonly installed on the GPU to dissipate the heat generated by the GPU and other electronic components adjacent to it into ambient air. Generally, the heat sink comprises a base and a plurality of fins mounted on the base. The base is attached on the GPU mounted on the VGA card so as to absorb the heat. A fan is installed at a lateral side of the fins. An airflow is generated by the fan to flow through channels of the fins, thereby taking the heat away. However, temperature in the computer enclosure can still become relatively high and if the hot airflow flowing through the fins is not instantly exhausted out of the computer enclosure, the hot airflow may adversely affect heat dissipation performance of the computer system.

Accordingly, what is needed is a heat dissipation device with an enhanced heat dissipation performance.

SUMMARY OF THE INVENTION

According to an embodiment of the present invention, a heat dissipation device mounted in a computer enclosure includes a heat sink, a fan and a fan duct connecting the heat sink and the fan. The heat sink contacts a heat-generating device of an add-on card in the computer enclosure. The fan has an inlet port and an outlet port. The outlet port is exposed to ambient air outside the computer enclosure. The fan duct has two opposite free open ends. One of the open ends engages with the heat sink and the other open end engages with the inlet port of the fan. When the fan is operated, an airflow flows through the heat sink, the fan duct, the inlet port of the fan, and the outlet port of the fan to reach the ambient air outside the computer enclosure. Thus, the heat generated by the heat-generating device can be quickly and efficiently expelled out of the computer enclosure.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views. Other advantages and novel features will become more apparent from the following detailed description of preferred embodiment when taken in conjunction with the accompanying drawings, in which.

DETAILED DESCRIPTION OF THE INVENTION

Figure 1:
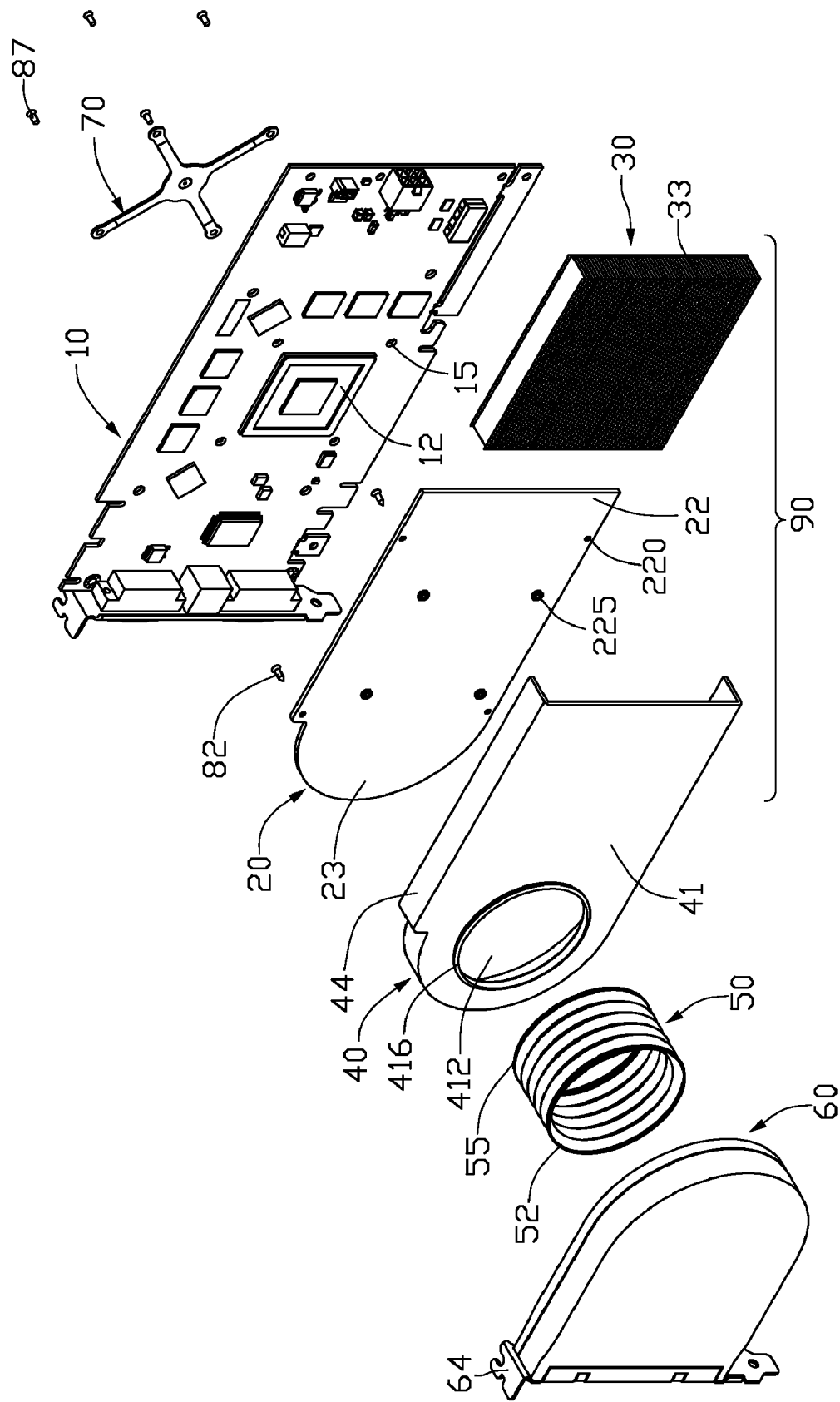
FIG. 1 is an exploded, isometric view of a heat dissipation device in accordance with a preferred embodiment of the present invention.
Figure 2:
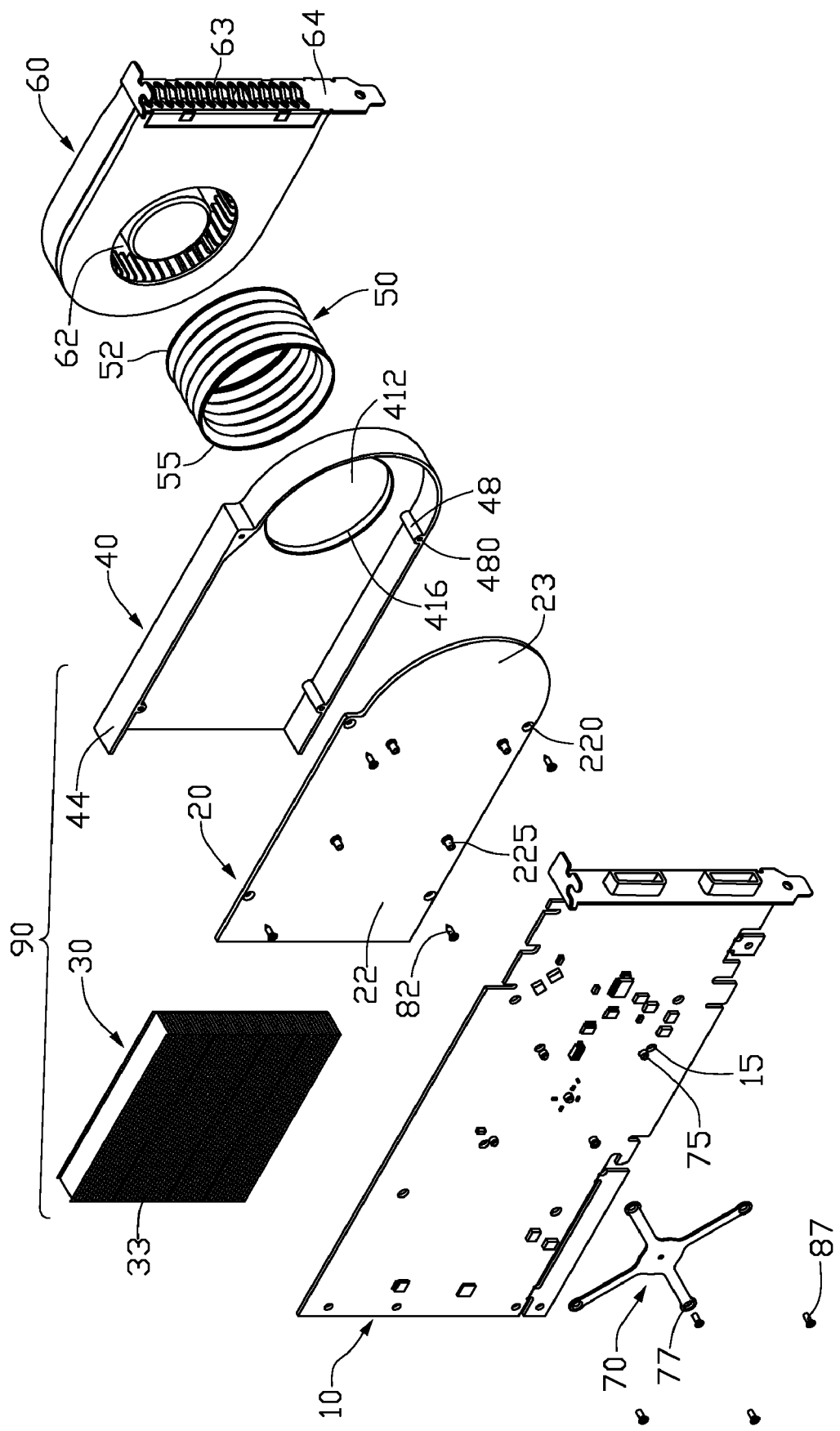
FIG. 2 a view similar to FIG. 1, but shown from another aspect.

Referring to FIGS. 1-2, a heat dissipation device (not labeled) in accordance with a preferred embodiment of the present invention is illustrated. The heat dissipation device is to be mounted in a computer enclosure (not shown). The heat dissipation device mainly comprises a heat sink 90, a fan 60, and a fan duct 50 connecting the fan 60 and the heat sink 90. The heat sink 90 is mounted onto a VGA card 10 for dissipation of heat generated by a graphic processing unit (GPU) 12 of the VGA card 10.

The heat sink 90 comprises a base 20, a plurality of fins 30 soldered to the base 20, and a cover 40 mounted on the base 20. The cover 40 covers the fins 30.

The base 20 is secured to the VGA card 10 by a back plate 70 and with a plurality of screws 87. The base 20 has a plate configuration. The base 20 comprises a rectangular main body 22 and a semicircular extension 23 extending from a lateral side of the main body 22. The main body 22 defines four through holes 220 at an edge thereof. Four threaded protrusions 225 are formed on the main body 22 for engaging with the corresponding screws 87, thus assembling the VGA card 10, the back plate 70 and the base 20 are together. The screws 87 extend through the back plate 70, the VGA card 10 and threadedly engage in the threaded protrusions 225. The fins 30 are aligned parallel to each other to form channels 33 therebetween.

The cover 40 has a configuration similar to that of the base 20, and comprises a top wall 41 spaced from the base 20 and a sidewall 44 extending downwardly from an edge of the top wall 41. The top wall 41 defines an opening 412 therein. The opening 412 is aligned with an inlet port 62 of the fan 60. An annular flange 416 extends upwardly at an inner edge of the opening 412 of the top wall 41 for engaging with the fan duct 50. Four poles 48 having inner holes 480 are formed on an inner side of the sidewall 44 corresponding to the through hole 220 of the base 20 for engaging with screws 82 to assemble the base 20 and the cover 40 together.

The fan duct 50 is connected between the heat sink 90 and the fan 60. The fan duct 50 is made of flexible material, such as plastic and has a bellows-like structure; thus the fan duct 50 is a telescopic tube. A length of the fan duct 50 is adjustable. The fan duct 50 can be adjusted freely according to different height requirements. The fan duct 50 has two free opposite open ends 52, 55. One open end 55 of the fan duct 50 is engaged with the annular flange 416 of the cover 40. Another opposite open end 52 of the fan duct 50 is engaged with the inlet port 62 of the fan 60.

The fan 60 defines the inlet port 62 connecting the open end 52 of the fan duct 50 and an outlet port 63 perpendicular to the inlet port 62. The fan 60 comprises a mounting plate 64 for mounting the fan 60 on a side panel of the computer enclosure. The outlet port 63 is defined on the mounting plate 64 to communicate with the inner space of the computer enclosure and ambient air outside the computer enclosure.

The back plate 70 is attached to a bottom side of the VGA card 10 opposite to the heat sink 90. The back plate 70 is X-shaped and defines four through holes 77 therein. Five partition gaskets 75 are fixed between the VGA card 10 and the back plate 70 to prevent a physical contact between the back plate 70 and the VGA card 10, wherein the back plate 70 is usually made of metal.

Figure 3:
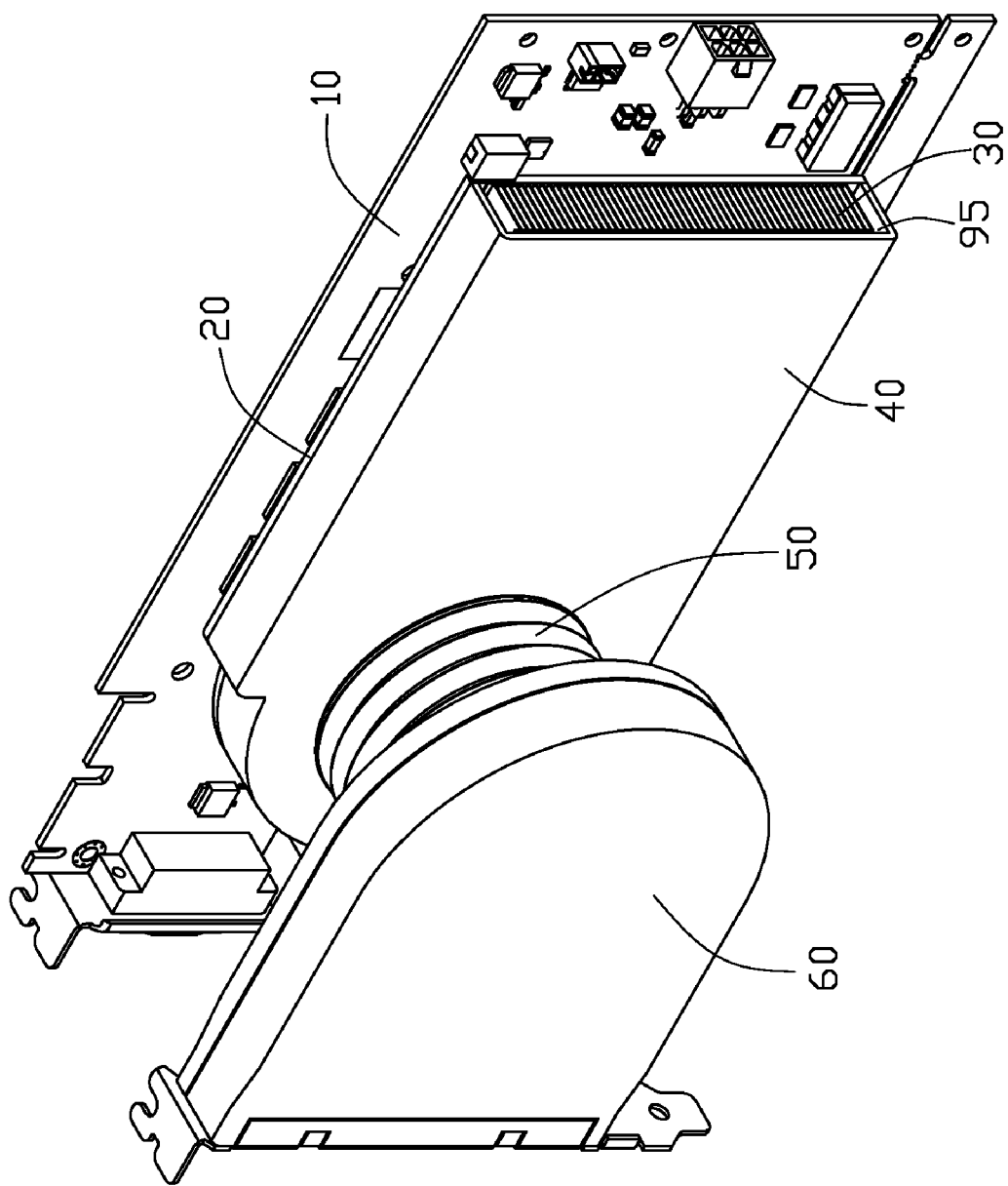
FIG. 3 is an assembled view of FIG. 1.
Figure 4:
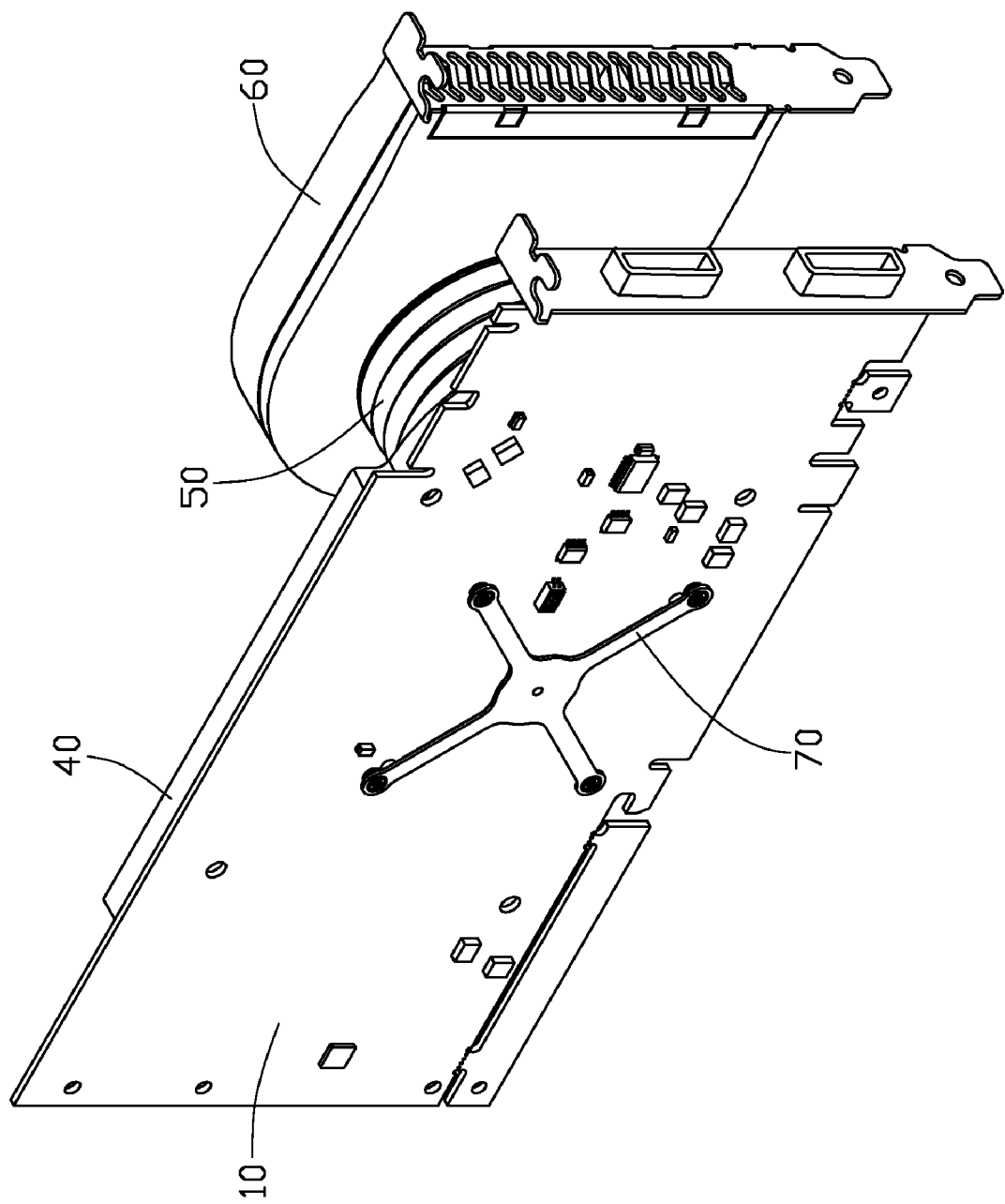
FIG. 4 is an assembled view of FIG. 2.

Also referring to FIG. 3 and FIG. 4, the fins 30 and the cover 40 are installed on the base 20. The heat sink 90 forms an intake 95 between the cover 40 and the base 20, and the fins 30 have a side which is adjacent to the intake 95 of the heat sink 90. The screws 87 extend through the through holes 77 of the backboard 70 and through holes 15 of the VGA card 10 and are threadedly engaged in the threaded protrusions 225 of the base 20; thus, the heat sink 90 is securely fixed to the VGA card 10. The fan duct 50 connects the opening 412 of the cover 40 with the inlet port 62 of the fan 60. After assembled, the fan 60, the heat sink 90 and the VGA card 10 are oriented substantially parallel to each other, while the fan duct 50 is oriented perpendicular to the fan 60, the heat sink 90 and the VGA card 10.

In operation of the heat dissipation device, the GPU 12 generates heat. The heat is transferred to the fins 30 via the base 20. When the fan 60 is operated, the hot airflow flowing through the fins 30 is sucked by the fan 60 via the fan duct 50 and then is exhausted out of the computer enclosure via the outlet port 63 of the fan 60. Thus the heat generated by the GPU 12 is removed quickly.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device mounted in a computer enclosure, comprising:
   a heat sink for contacting a heat-generating device of a VGA card in the computer enclosure;
   a fan having an inlet port and an outlet port, the outlet port communicating with an inner space of the computer enclosure and outer ambient air outside the computer enclosure; and
   a fan duct having two opposite free open ends, one of the open ends engaging with the heat sink and the other open end engaging with the inlet port of the fan;
   wherein when the fan is operated, an airflow is generated to flow through the heat sink, the fan duct, the inlet port of the fan and then the outlet port of the fan to reach the outer ambient air outside the computer enclosure, whereby heat generated by the heat-generating device of the VGA card is dissipated to the outer ambient air;
   wherein the heat sink comprises a base, a plurality of fins mounted on the base and a cover mounted to the base and covering the fins;
   wherein an intake is defined by the base and the cover of the heat sink, and the cover defines an opening in alignment with the fan duct; and
   wherein the base comprises a rectangular main body and a semicircular extension extending from a lateral side of the main body, the fins being mounted on the main body of the base and the opening of the cover facing to the semicircular extension of the base.

2. The heat dissipation device as described in claim 1, wherein the cover comprises a top wall spaced from the base and a sidewall extending downwardly from an edge of the top wall, and the sidewall comprises two straight portions and a semicircular portion corresponding to the semicircular extension of the base.

3. The heat dissipation device as described in claim 1, wherein the fan, the heat sink and the VGA card are oriented substantially parallel to each other.

4. The heat dissipation device as described in claim 1, wherein the fan comprises a mounting plate for mounting the fan on the computer enclosure.

5. The heat dissipation device as described in claim 1, wherein the fan duct is made of flexible material.

6. The heat dissipation device as described in claim 1, wherein a length of the fan duct is adjustable.

7. A computer add-on card assembly comprising:
   an add-on card having a heat-generating electronic component mounted thereon;
   a heat sink mounted on the add-on card, comprising:
   a base in thermal connection with the heat-generating electronic component, the base comprising a rectangular main body and a semicircular extension extending from a lateral side of the main body;
   a plurality of fins mounted on the base except the semicircular extension of the base, and channels defined between the fins; and
   a cover mounted to the base in a such manner as to cover the fins;
   a blower fan; and
   a telescopic fan duct mounted between the cover and the fan to communicate with the channels of the fins and the fan, wherein the fan has an inlet port in communication with the fan duct and an outlet port adapted for communicating with an outer ambient air outside a computer enclosure when the computer add-on card assembly is mounted in the computer enclosure;
   wherein the fan duct is in alignment with the semicircular portion of the base.

8. The computer add-on card assembly as described in claim 7, wherein the fan duct has a hollow cylindrical configuration.

9. The computer add-on card assembly as described in claim 7, wherein the fan duct is made of flexible material.

10. The computer add-on card assembly as described in claim 7, wherein the fan duct has two opposite free open ends, one of the open ends engaging with the cover and the other open end engaging with the fan.

11. The computer add-on card assembly as described in claim 10, wherein the cover comprises a top wall spaced from the base and a sidewall extending downwardly from an edge of the top wall, and the sidewall comprises two straight portions and a semicircular portion corresponding to the semicircular extension of the base, and the top wall defines an opening in alignment with the fan duct.

12. The computer add-on card assembly as described in claim 7, wherein a back plate is attached to a bottom of the add-on card for securing the base to the heat-generating electronic component.

13. The computer add-on card assembly as described in claim 7, wherein the add-on card, the heat sink and the fan are oriented substantially parallel to each other, while the fan duct is oriented perpendicular to the add-on card, the channels of the heat sink and the fan.

* * * * *